(12) United States Patent
Lautman

(10) Patent No.: US 10,689,209 B2
(45) Date of Patent: Jun. 23, 2020

(54) NONCONTACT SUPPORT PLATFORM WITH EDGE LIFTING

(71) Applicant: Core Flow Ltd., Daliyat el Carmel (IL)

(72) Inventor: Ronen Lautman, Haifa (IL)

(73) Assignee: CORE FLOW LTD., Daliyat El-Karmel (IL)

( * ) Notice: Subject to any disclaimer, the term of this patent is extended or adjusted under 35 U.S.C. 154(b) by 0 days.

(21) Appl. No.: 16/308,821

(22) PCT Filed: Mar. 6, 2017

(86) PCT No.: PCT/IL2017/050274
§ 371 (c)(1),
(2) Date: Dec. 11, 2018

(87) PCT Pub. No.: WO2017/221229
PCT Pub. Date: Dec. 28, 2017

(65) Prior Publication Data
US 2019/0193955 A1    Jun. 27, 2019

Related U.S. Application Data

(60) Provisional application No. 62/352,571, filed on Jun. 21, 2016.

(51) Int. Cl.
*B65G 51/03* (2006.01)
*B65G 49/06* (2006.01)
*H01L 21/677* (2006.01)

(52) U.S. Cl.
CPC .......... *B65G 49/065* (2013.01); *B65G 49/06* (2013.01); *B65G 51/03* (2013.01); *H01L 21/67784* (2013.01); *B65G 2249/04* (2013.01)

(58) Field of Classification Search
CPC .. B65G 51/03; B65G 49/065; H01L 21/67784
(Continued)

(56) References Cited

U.S. PATENT DOCUMENTS 4,066,254 A * 1/1978 Stange .................. B65H 5/228
271/195
4,526,648 A * 7/1985 Tochtermann ............ B65C 9/28
156/497

(Continued)

FOREIGN PATENT DOCUMENTS

EP         1461826      4/2010
JP       2008-310249   12/2008

(Continued)

OTHER PUBLICATIONS

International Search Report for PCT Application No. PCT/IL2017/050274 dated Jun. 25, 2017.

(Continued)

*Primary Examiner* — Joseph A Dillon, Jr.
(74) *Attorney, Agent, or Firm* — Pearl Cohen Zedek Latzer Baratz LLP

(57) ABSTRACT

A noncontact support platform includes pressure ports distributed on a surface of a table, each connected to a pressure source. Vacuum ports are distributed on the surface of the table, each connected to a vacuum source. Outward flow through the pressure ports and inward flow through the vacuum ports form a fluid cushion to support a workpiece at a nonzero distance from the table. A plurality of channels each connect at least two of the vacuum ports to enable flow of fluid between the connected vacuum ports. When one of the connected vacuum ports is covered by an edge of the workpiece and the other is not, a suction force that is exerted by the connected vacuum ports on the edge is weaker than the suction force that is exerted on a part of the workpiece where both of the connected vacuum ports are covered.

9 Claims, 4 Drawing Sheets

(58) Field of Classification Search
USPC .......... 406/88; 414/676; 271/195; 65/182.2; 108/50.13
See application file for complete search history.

(56) References Cited

U.S. PATENT DOCUMENTS

| | | | | |
|---|---|---|---|---|
| 5,562,396 | A * | 10/1996 | Yamazaki | B23Q 1/38 414/676 |
| 6,739,254 | B2 * | 5/2004 | Frankenberger | B65H 5/228 101/232 |
| 6,781,684 | B1 | 8/2004 | Ekhoff | |
| 7,269,475 | B1 * | 9/2007 | Hogg | B65H 5/228 406/19 |
| 7,464,929 | B2 * | 12/2008 | Hachmann | B41F 21/00 101/230 |
| 7,905,195 | B2 * | 3/2011 | Yamasaki | H01L 21/67784 118/300 |
| 9,550,633 | B2 * | 1/2017 | Tsunoda | B65G 49/065 |
| 9,889,995 | B1 * | 2/2018 | Nishri | B65G 51/03 |
| 2003/0146340 | A1 * | 8/2003 | Ebner | B65G 51/03 242/615.11 |
| 2007/0045499 | A1 | 3/2007 | Kim et al. | |
| 2007/0195653 | A1 * | 8/2007 | Yassour | B24B 37/30 369/13.24 |
| 2007/0228630 | A1 * | 10/2007 | Grundmuller | B23K 26/10 269/71 |
| 2008/0229811 | A1 * | 9/2008 | Zhao | B25B 11/005 73/104 |
| 2009/0013927 | A1 * | 1/2009 | Yamasaki | B65G 49/065 118/300 |
| 2011/0167871 | A1 * | 7/2011 | Vehmas | C03B 23/035 65/25.2 |
| 2011/0268511 | A1 * | 11/2011 | Iida | B65G 49/065 406/88 |
| 2013/0130510 | A1 * | 5/2013 | Bok | H01L 21/677 438/758 |
| 2014/0161577 | A1 * | 6/2014 | Richman | B65G 51/03 414/676 |
| 2014/0199788 | A1 * | 7/2014 | Vermont | C23C 16/403 438/5 |
| 2015/0314968 | A1 * | 11/2015 | Van Ostayen | H01L 21/67784 406/88 |
| 2015/0336751 | A1 | 11/2015 | Tsunoda et al. | |
| 2017/0221719 | A1 * | 8/2017 | Olson | H01L 21/30604 |
| 2018/0178993 | A1 * | 6/2018 | Imaoka | B65G 49/065 |

FOREIGN PATENT DOCUMENTS

| | | |
|---|---|---|
| JP | 2010-232472 | 10/2010 |
| JP | 2013-091540 | 5/2013 |

OTHER PUBLICATIONS

Supplementary European Search Report for European Patent Application No. 17814881.3, dated Feb. 4, 2020.

* cited by examiner

NONCONTACT SUPPORT PLATFORM WITH EDGE LIFTING

CROSS-REFERENCE TO RELATED APPLICATIONS

This application is a National Phase Application of PCT International Application No. PCT/IL2017/050274, International Filing Date Mar. 6, 2017, claiming priority of U.S. Patent Application No. 62/352,571, filed Jun. 21, 2016, which is hereby incorporated by reference.

FIELD OF THE INVENTION

The present invention relates to noncontact support platforms. More particularly, the present invention relates to a noncontact support platform that is configured to lift the edges of a workpiece.

BACKGROUND OF THE INVENTION

A noncontact support platform is capable of holding a flat workpiece at a fixed distance from the solid table surface of the platform. The solid table surface is configured with openings through which air may form to form an air cushion upon which the workpiece may be supported. The supported workpiece may be inspected or transported to various locations (e.g., for processing or for addition of additional components or structure).

Typically, the table includes air outlets through which pressurized air is provided. The pressurized air may form the air cushion that supports the workpiece above the solid table surface. Other fluids, such as gas or liquids, may be used as well.

Air inlets may be interspersed among the air outlets. The air may then circulate between the air outlets and the air inlets. For example, suction may be applied to the air inlets to cause air inflow, or the air inlets may be at, or close to, atmospheric pressure. In some cases, the interspersion of air inlets with the air outlets may result in an air cushion that exhibits a fluidic spring effect. The fluidic spring effect may apply a restoring force to any increase or decrease in the distance between a supported workpiece and the solid table surface. The fluidic spring effect may thus hold the workpiece at a fixed distance from the solid table surface.

In some cases, the workpiece may be thin enough that any variation in the air cushion may bend the workpiece. For example, such thin workpieces may include panes of glass, e.g., for forming a layer of a flat display screen (e.g., based on a liquid crystal display, on light-emitting diodes, on a plasma screen, or otherwise).

SUMMARY OF THE INVENTION

There is thus provided, in accordance with an embodiment of the present invention, a noncontact support platform including: a plurality of pressure ports distributed on a surface of a table, each pressure port configured to be connected to a pressure source to cause fluid to flow outward through the pressure port; a plurality of vacuum ports distributed on the surface of the table, each vacuum port configured to be connected to a vacuum source to cause fluid to flow inward through the vacuum port, the outward flow through the pressure ports and the inward flow through the vacuum ports configured to form a fluid cushion to support a workpiece at a nonzero distance from the table; and a plurality of channels, each channel connecting at least two of the vacuum ports to enable flow of fluid between the connected vacuum ports via the channel, such that when one of the connected vacuum ports is covered by an edge of the workpiece and the other connected vacuum port is not covered by the workpiece, a suction force that is exerted by the connected vacuum ports on the edge is weaker than the suction force that is exerted by the connected vacuum ports on a part of the workpiece where both of the connected vacuum ports are covered.

Furthermore, in accordance with an embodiment of the present invention, the plurality of channels are oriented non-perpendicularly to a direction of transport of the workpiece along the noncontact support platform.

Furthermore, in accordance with an embodiment of the present invention, the plurality of channels are oriented at an oblique angle to a side of the table.

Furthermore, in accordance with an embodiment of the present invention, the table is rectangular and the plurality of channels are oriented at a 45° angle to a side of the table.

Furthermore, in accordance with an embodiment of the present invention, a channel of the plurality of channels includes a constriction.

Furthermore, in accordance with an embodiment of the present invention, the constriction is wedge-like, rectangular or labyrinthine.

Furthermore, in accordance with an embodiment of the present invention, the constriction includes a self adaptive segmented orifice (SASO) labyrinth.

Furthermore, in accordance with an embodiment of the present invention, at least three collinear vacuum ports are connected to one another by at least two channels.

Furthermore, in accordance with an embodiment of the present invention, the plurality of channels are incorporated into a layer that is configured for assembly into the table.

Furthermore, in accordance with an embodiment of the present invention, the fluid includes air.

There is further provided, in accordance with an embodiment of the present invention, a table for producing a fluid cushion of a noncontact support platform, the table including: a table top on which are distributed a plurality of pressure ports, each pressure port configured to be connected to a pressure source to cause fluid to flow outward through the pressure port; a plurality of vacuum ports that are interspersed with the pressure ports on the table top, each vacuum port configured to be connected to a vacuum source to cause fluid to flow inward through the vacuum port, the outward flow through the pressure ports and the inward flow through the vacuum ports configured to form the fluid cushion to support a workpiece at a nonzero distance from the table; and a plurality of channels, each channel connecting at least two of the vacuum ports to enable flow of fluid between the connected vacuum ports via the channel, such that when one of the connected vacuum ports is covered by an edge of the workpiece and the other connected vacuum port is not covered by the workpiece, a suction force that is exerted by the connected vacuum ports on the edge is weaker than the suction force that is exerted by the connected vacuum ports on a part of the workpiece where both of the connected vacuum ports are covered.

BRIEF DESCRIPTION OF THE DRAWINGS

In order for the present invention, to be better understood and for its practical applications to be appreciated, the following Figures are provided and referenced hereafter. It should be noted that the Figures are given as examples only FIG. 1A schematically illustrates a noncontact support table with edge lifting, in accordance with an embodiment of the present invention.

DETAILED DESCRIPTION OF THE INVENTION

Figure 1A:
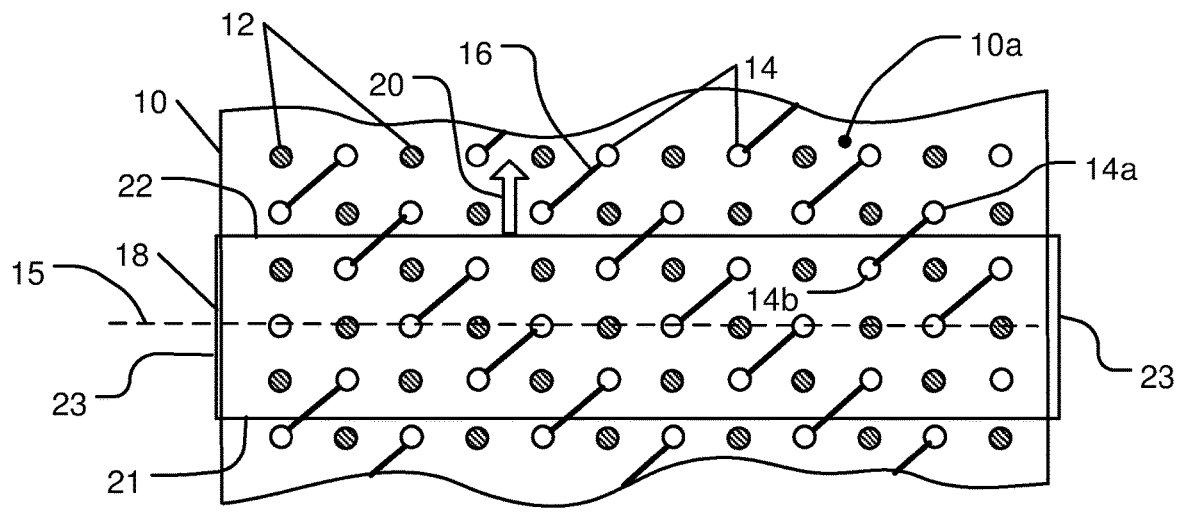
FIG. 1B schematically illustrates a side view of the noncontact support platform shown in FIG. 1A.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

In accordance with an embodiment of the present invention, a noncontact support platform is configured to prevent or reduce downward bending of edges of a supported object. For example, the supported object may be in the form of a thin, nominally flat plate or sheet of glass, silicon, plastic, or another material. Such a thin flat object is herein referred to as a workpiece. For example, in some cases a typical workpiece may include a sheet of glass whose thickness is less than a millimeter, e.g., about half a millimeter. An object is considered herein to be nominally flat when it is provided or intended for an application where no minimum curvature, bending, or folding is required. A nominally flat object, or its edges, may be bent, warped, or curved, e.g., as a result of manufacturing tolerances, handling, processing, storage, or other causes.

For example, the noncontact support platform may include a noncontact support platform table whose table top includes a plurality of openings. The openings include pressure ports that are distributed across the table top. Each pressure port may be connected, e.g., via a manifold that is enclosed within the noncontact support platform table, to a pressure source. For example, the pressure source may include a blower, pump, or other device that is configured to intake ambient air (or another gas or fluid) and force the air outward via the pressure ports. Although a typical noncontact support platform operates used in an environment of an ambient air atmosphere, in some cases the noncontact support platform may operate in an environment where another fluid, gas or liquid, is present. References herein to air and to airflow should be understood as including any such fluid and fluid flow, respectively. Similarly, reference herein to an air cushion should be understood as a fluid cushion that is formed by flow of any such fluid.

Vacuum ports are interspersed among the pressure ports. Each vacuum port is connected to a vacuum source. For example, the vacuum source may include a blower, pump, or other device that is configured to draw air from the ambient atmosphere into the vacuum ports.

Concurrent operation of the pressure and vacuum ports when a workpiece is placed close to and substantially parallel to the table top may support the workpiece at a substantially fixed (for all parts of a flat workpiece) nonzero distance from the table top. For example, the operation or the pressure and vacuum ports may create a fluidic spring effect that resists any deviation from an equilibrium distance from the table top. In this case, the table top may be located either below or above the supported workpiece. Reference herein to a table top should be understood as a referring to a surface of the noncontact support platform table that is configured to face the workpiece, and which contains the pressure and vacuum ports, whether or not that surface faces upward.

The plurality of vacuum ports includes pairs of vacuum ports that are connected to one another by a connection that enables air to flow between the connected vacuum ports. The connection between vacuum ports may include a channel or nozzle that is internal to the table of the noncontact support platform. The connection may include tubes or hoses that are located external to the table, e.g., connecting fittings that are each connected to one of the vacuum ports. Reference herein to a channel, a connecting channel, or an airflow channel should be understood as including either an internal or an external connection.

Thus, the intake airflow through one of the interconnected vacuum ports may be affected by intake airflow through the other vacuum port of the pair. The channel that connects a pair of vacuum ports is oriented in a direction that is not perpendicular to an expected longitudinal direction of transportation of a workpiece along the noncontact support platform. For example, the channel may be oriented parallel to, or at an oblique angle to, the expected direction of transportation. In other words, the channel connects two vacuum holes whose relative (vector) displacement has a non-zero component that is parallel to the expected direction of transportation.

For example, the channels may be orientated at an oblique angle to a side of a rectangular noncontact support platform table. In some cases, the channels may be oriented at a 45° angle to the sides of a rectangular noncontact support platform table.

Transportation of the workpiece may be effected by a propulsion component of a system that includes the noncontact support platform. For example, the propelling component may be configured to propel the workpiece by applying mechanical or pneumatic techniques. Transportation of the workpiece may be limited to a single linear direction, to two or more (e.g., orthogonal or otherwise nonparallel) linear directions, or may be enabled in two dimensions. In the latter case, the channels that connect various pairs of vacuum ports may be oriented in several directions so as to ensure that at least some of the channels are not perpendicular to the direction of transportation of a particular workpiece.

Since the orientation of the channels is non-perpendicular to the direction of transportation, the ratio of suction force to pressure force at the edges of the workpiece may be different than at the interior of the workpiece. At the interior of the workpiece, away from the edges, the intake airflow through any of the vacuum ports may be approximately equal to the intake airflow through any of the other vacuum ports. Similarly, the air outflow through each pressure port may be approximately equal to the outflow through any of the other pressure ports. Thus, the support forces on the entire interior of the workpiece may be approximately constant over the entire interior, and may thus be supported at a constant distance from the table top of the noncontact support platform.

The pattern of intake airflow, and the balance between intake airflow through the vacuum ports and outflow through the pressure ports, may be altered in the vicinity of edges of the workpiece. In particular, the distance of a leading edge of a transported workpiece from the table top of the noncontact support platform may be greater than the distance between an interior point of the workpiece and the table top.

For example, at a leading edge of the workpiece, one of a pair of connected vacuum ports may be covered by the workpiece. The other vacuum port of the pair, located at a part of the noncontact support platform ahead of the leading edge, may not be covered by the workpiece. The uncovered vacuum port of the pair may thus be exposed to the ambient atmosphere. In this case, the intake airflow through the air intake may be greater through the exposed vacuum port of the pair than through the covered vacuum port. As a result, the suction force that is applied to leading edge may be weaker than the suction force that is applied to an interior point of the workpiece. On the other hand, the air outflow through the pressure ports near the leading edge, which are not interconnected, may be substantially equal to the outflow from a pressure port at the interior of the workpiece. Thus, a net lifting force of the air cushion (e.g., resulting from pushing forces produced by a net the pressure outflow and pulling forces produced by vacuum inflow) that is exerted on an edge of the workpiece may be greater than a net lifting force that is exerted by the air cushion on an interior point or region of the workpiece where both of the connected vacuum ports are covered by the workpiece. Therefore, the distance between the leading edge and the table top of the noncontact support platform may be greater than what the distance would be in the absence of connecting channels.

As used herein, a net lifting force refers to a net force per unit area of, or in a region of, a workpiece that tends to push the region of the workpiece away from the table top of the noncontact support platform, whether that force is upward, e.g., where the table top is located below the workpiece, or downward, e.g., where the table top is located above the workpiece. A net lifting force results from a net outflow per unit area of region of the table top that supports a corresponding region of the workpiece (e.g., at a particular time or when the workpiece is at a particular position relative to the table top. The net outflow may be defined as the difference between pressure outflow (e.g., per unit area or in a region of the table top) by pressure ports of a noncontact support platform table, and the vacuum inflow (e.g., per unit area or in a region of the table top) via vacuum ports of the noncontact support platform table in a region of the noncontact support platform table that supports a corresponding region of the workpiece.

Similar processes at other edges of the workpiece that do not extend to the edge of the noncontact support platform may increase the lifting of those other edges that are not parallel to the connecting channels. For example, the other edges may include a trailing edge of the workpiece, or a lateral edge (e.g., a side of the workpiece that is substantially parallel to the direction of movement, or that is otherwise not a leading or trailing edge).

The increased lifting of an edge of the workpiece may be advantageous. For example, in some processes, the workpiece may become warped such that the edges of the workpiece may tend to bend toward the table top of the noncontact support platform. For example, a process may include heating of the workpiece on a side of the workpiece that faces away from the table top. In this case, the heating may expand the heated face more than the face of the workpiece that faces the table top. Thus, the workpiece may assume a generally concave shape (as viewed from the direction of the table top), bending the edges of the workpiece toward the table top. In this case, the increased lifting of the edges that may result from the connecting channels may counteract the warping due to the processing. For example, the increase lifting may be configured to balance the warping, so as to flatten the workpiece. The flattening of the workpiece may thus prevent edges of the workpiece from coming into physical contact with the table top of the noncontact support platform. Such contact between the workpiece and the table top, if it were to be enabled, could result in damage to the workpiece, to the table top, or to both.

Flattening of the workpiece may facilitate processing or inspection of the workpiece. For example, processing may include a masking process, an inspection process, a curing process, a printing process (e.g. inkjet printing), a laser cutting process, a laser annealing process, a laser scribing process.

In some cases, increase lifting of a leading edge of the workpiece could enable or facilitate transport of the leading edge over a gap in the noncontact support platform (e.g., resulting from a gap between two adjacent noncontact support platform table tops, a gap within a single noncontact support platform table top, or other gap in the noncontact support platform). Thus, a noncontact support platform with edge lifting may enable or facilitate support of thinner or more flexible workpieces than could be safely or efficiently supported and transported in the absence of edge lifting.

In some cases, the channels may be oriented at a 45° angle to a typical direction of transport of a workpiece along the noncontact support platform. Thus, the channel is non-perpendicular to the direction of travel of a workpiece that is being transported along either of two orthogonal directions. Therefore, in the case of a rectangular workpiece, the edge lifting resulting from connection of vacuum ports by the channels may result in increased lifting of all edges of the workpiece (e.g., leading, trailing, and lateral edges). In some cases, the angle may be different from 45°. Although rectangular workpieces are described herein for simplicity, a workpiece may be polygonal, circular, oval or elliptical, or otherwise shaped.

In some cases, more than two vacuum ports may be connected by channels. For example, three or four collinear vacuum ports may be connected by substantially collinear channels. Other numbers and patterns of three or more vacuum ports may be interconnected by channels.

Channels may be shaped so as to restrict airflow. For example, the channel may be constricted along its length (e.g., near the middle of the channel). In some cases, the channel may be provided with alternating obstacles to form a self adaptive segmented orifice (SASO) labyrinth.

A form of a channel may be selected in accordance with a planned use of the noncontact support platform. For example, the table of the noncontact support platform may be configured for a use with a particular type of workpiece (e.g., characterized by a composition, thickness, or other characteristic) that is subjected to a particular process (e.g., type or degree of heating, or other processes that could affect bending or warping of the workpiece).

For example, where bending or warping of a workpiece is expected to be relatively large, the channels may be configured for relatively unrestricted airflow between the connected vacuum ports. In this case, e.g., each channel may have a uniform width along its length. Thus, the net lifting force at the edges of the workpiece may be sufficiently larger than the net lifting force on the interior of the workpiece so as to counteract the relatively large bending or warping to flatten the workpiece.

On the other hand, where the bending or warping is expected to be as relatively small, the channels may be configured to enable a relatively restricted airflow between the connected vacuum ports. For example, the channels may be constructed with a narrow uniform width, or one or more constricting structures may be introduced into the channels. In this case, the net lifting force at the edges of the workpiece may be only slightly larger than the lifting force at the interior of the workpiece.

In some cases, a table of a noncontact support platform with edge lifting may be constructed of layers. For example, an outermost layer may include an array of ports that function as the pressure and vacuum ports that form the noncontact support platform for supporting the workpiece. An innermost layer may include connections of the pressure ports and the vacuum ports to the pressure and vacuum sources, respectively. For example, bores in the innermost and outermost layers may be aligned with one another when the table is assembled to form the pressure and vacuum ports. For example, the different layers may include bores that are configured to accommodate bolts, rods, or columns when the layers are aligned with one another.

One or more middle layers may include channels for connecting the vacuum ports to one another. For example, the channels may be formed by machining (e.g., by laser cutting or otherwise) slots in the form of the channels in a sheet of metal, plastic, or another suitable material. The ends of the channels may be configured to be sandwiched between the bores that form the vacuum ports in the innermost and the outermost layers when the table is assembled. Thus, when the tabled is assembled, the vacuum ports may be connected by the channels formed in the middle layer.

Such layered construction of the table may facilitate adapting the table to a particular purpose. For example, the outermost and innermost layers may be mass produced. The middle layers may be selected from a selection of mass produced middle layers (e.g., with different channel configurations), or may be customized for a particular purpose. A table of a noncontact support platform system that was originally assembled for one purpose may be reconfigured for a different purpose by disassembling the layers of the original table, and by reassembling the table with replaced middle layers.

Figure 1B:
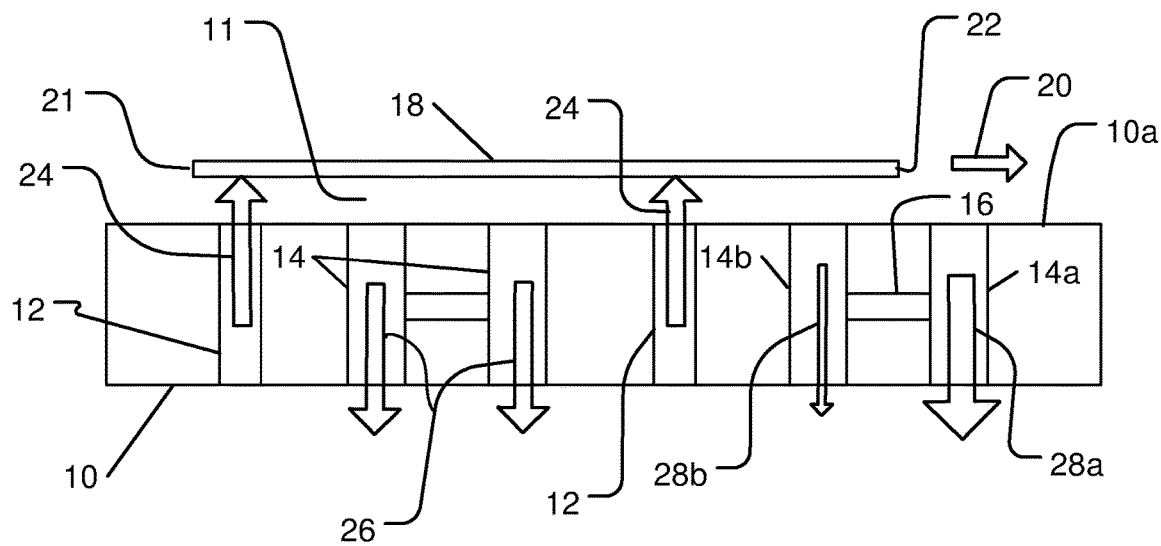

FIG. 1A schematically illustrates a noncontact support platform with edge lifting, in accordance with an embodiment of the present invention. FIG. 1B schematically illustrates a side view of the noncontact support platform shown in FIG. 1A.

Noncontact support platform table 10 is configured to support a workpiece 18 on air cushion 11. For example, when workpiece 18 is supported by air cushion 11, workpiece 18 may be transported in transport direction 20. In this case, where workpiece 18 is rectangular and is transported in transport direction 20, workpiece 18 includes leading edge 22, trailing edge 21, and lateral edges 23.

Air cushion 11 may be formed by airflow between table top 10a of noncontact support platform table 10 and workpiece 18. For example, air may flow outward of pressure ports 12 as indicated by pressure outflow 24 may exert an outward force on workpiece 18 (e.g., away from noncontact support platform table 10). Pressure outflow 24 may be approximately the same for all pressure ports 12, e.g., whether or not that pressure port 12 is covered by an interior point of workpiece 18.

Each vacuum port 14 may be connected to a vacuum source. Neighboring or adjacent vacuum ports 14 are connected by airflow channels 16. In the example shown, only each pair of adjacent vacuum ports 14 is connected by an airflow channel 16. Airflow channels 16 may be positioned in a staggered or alternating pattern. For example, in a single row of vacuum ports 14, such as row 15 (e.g., row 15 being perpendicular to transport direction 20 or parallel to leading edge 22, in the example shown), vacuum ports 14 along the row are alternatingly connected by airflow channels 16 to vacuum ports 14 in rows on opposite sides of row 15.

Although airflow channels 16 are shown schematically in the form of straight line segments that directly connect vacuum ports 14, an airflow channel 16 may include one or more bends or curves.

At the interior of workpiece 18, interior vacuum inflow 26 is approximately the same for all vacuum ports 14. Thus, the net outflow of air cushion 11 (e.g., defined as the difference between pressure outflow per unit area by pressure ports 12 of noncontact support platform table 10 and the vacuum inflow per unit area via vacuum ports 14 of noncontact support platform table 10 in a region of workpiece 18, or otherwise defined) may be approximately constant near all interior points of workpiece 18.

At an edge of workpiece 18, such as at leading edge 22, the net outflow of air cushion 11 may be greaten than near an interior point of workpiece 18. At an edge of workpiece 18 (e.g., at an edge where noncontact support platform table 10 extends beyond the edge of workpiece 18) one of the pair of connected vacuum ports 14 may be uncovered (e.g., is open to the ambient atmosphere) while the other connected vacuum port 14 is covered by workpiece 18. In the example shown, uncovered vacuum port 14*a* is not covered by workpiece 18 (e.g., is located ahead of leading edge 22 of workpiece 18 being transported in transport direction 20), while covered vacuum port 14*b* is covered by part of workpiece 18 near leading edge 22.

The covering of one of the pair of connected vacuum ports 14 while the other is uncovered may cause the vacuum inflow to significantly differ from interior vacuum inflow 26. In the example shown, uncovered vacuum inflow 28*a* through uncovered vacuum port 14*a* is increased relative to interior vacuum inflow 26. Covered vacuum inflow 28*b* through covered vacuum port 14*b* is decreased relative to interior vacuum inflow 26. As a result, the net outflow of air cushion 11 in the vicinity of leading edge 22 and covered vacuum port 14*b* may be greater than at an interior point of workpiece 18.

As a result of the increased the net airflow (e.g., the weaker suction force) near leading edge 22 (and, similarly, near trailing edge 21, in the example shown) of workpiece 18, air cushion 11 may apply an outward (e.g., outward from table top 10*a* of noncontact support platform table 10) bending force, referred to herein as edge lifting, to leading edge 22. For example, the outward bending force may be configured to counter a tendency to inward bending of leading edge 22. Such an inward bending tendency of leading edge 22 may be caused, e.g., by warping (e.g., caused by processing that heats the outer face of workpiece 18, or otherwise) or other bending of workpiece 18. An outward bending force that counters inward bending of edges of workpiece 18 may result in flattening of workpiece 18 (e.g., causing all parts of workpiece 18 to be held being at approximately the same distance from table top 10*a* of noncontact support platform table 10.

In the example, shown, each airflow channel 16 is oriented at an oblique angle (e.g., 45°) to transport direction 20 (and thus, in the example, shown, to edges of table top 10*a*). Thus, each airflow channel 16 is non-perpendicular both to transport direction 20, and to the direction that is orthogonal to transport direction 20. Thus, leading edge 22 and trailing edge 21 may be subjected to outward bending. In the cases of a rectangular workpiece 18, where lateral edges 23 do not extend beyond table top 10*a* of noncontact support platform table 10 (e.g., unlike the example shown in FIG. 1A), lateral edges 23 may also be subjected to edge lifting.

When vacuum ports 14 are connected by airflow channels 16 in a staggered or alternating pattern as shown in FIG. 1A and as described above, the number of connections by vacuum ports 14 of a row 15 to vacuum ports 14 on either side of row 15 may be approximately identical for all rows 15. (In some cases, e.g., where a row 15 includes an odd number of vacuum ports 14, or where the presence of structure, such as screws, bolts, access ports, or other structure interrupts the pattern of vacuum ports 14, the number of connections may vary between at least some rows 15.) As a result, the net outflow when an edge of workpiece 18 is at any row 15 may be approximately the same as when the edge is at any other row 15. Thus, when an edge, such as leading edge 22 or trailing edge 21 is transported along noncontact support platform table 10 in transport direction 20, the resulting bending of leading edge 22 or trailing edge 21 (and the flattening of workpiece 18) may remain substantially constant.

In the example shown, pressure ports 12 are shown as arranged in a uniform rectangular array on table top 10*a*. Vacuum ports 14 are shown as arranged in a similar uniform rectangular array that is displaced relative to the array of pressure ports 12. Other arrangements of pressure ports 12 and vacuum ports 14 may be used. In some cases, an arrangement of pressure ports 12 and of vacuum ports 14 may be affected by one or more design considerations. Similarly, the shapes or placement of airflow channels 16 may be affected by various design considerations. For example, design considerations may include placement of various processing and inspection devices, ports for enabling access to workpiece 18 by various processing or inspection devices, placement of components (e.g., screws, nuts, bolts, rods, or other components) that are required for construction or assembly of noncontact support platform table 10, or other design considerations.

In some cases, more than two vacuum ports 14 may be connected by an airflow channel 16. For example, connection of three or more collinear vacuum ports may increase the width of the region at each edge to which edge lifting is applied.

Figure 2A:
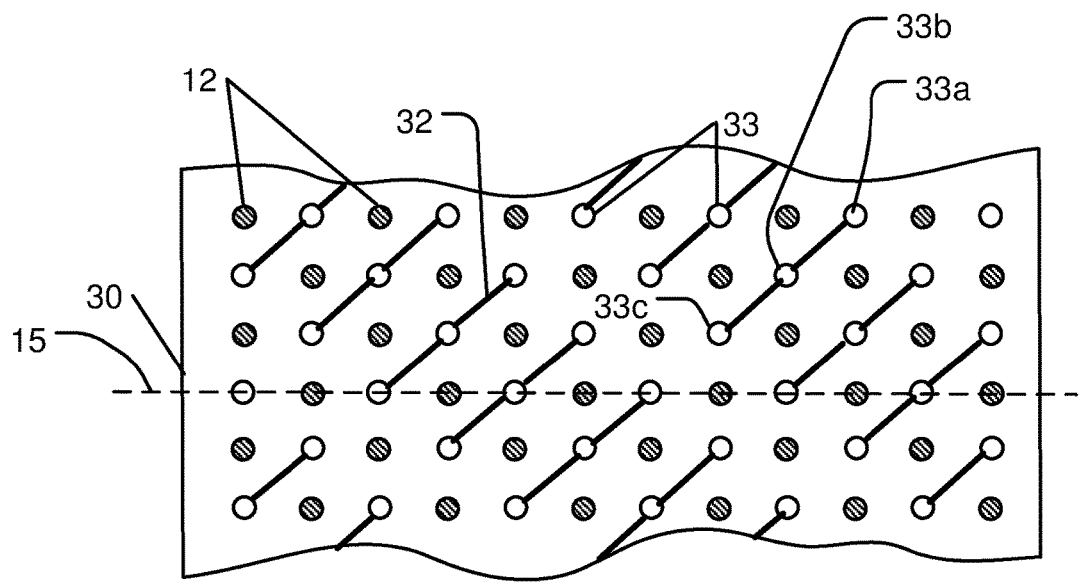
FIG. 2A schematically illustrates a variant of the noncontact support table shown in FIG. 1A in which each set of three collinear vacuum ports are connected by channels.

FIG. 2A schematically illustrates a variant of the noncontact support table shown in FIG. 1A in which each set of three collinear vacuum ports are connected by channels.

In noncontact support platform table 30, each set of three collinear vacuum ports 33 is connected by airflow channels 32. For example, a group of three collinear vacuum ports 33 that includes first vacuum port 33*a*, second vacuum port 33*b*, and third vacuum port 33*c* may be connected by airflow channels 32.

For example, first vacuum port 33*a* may be uncovered, and second vacuum port 33*b* and third vacuum port 33*c* may be covered by a workpiece 18. In this case, vacuum inflow through first vacuum port 33*a* may be increased (e.g., relative to inflow through a group of interconnected vacuum ports 33 that are at the interior of workpiece 18), and inflow through second vacuum port 33*b* and third vacuum port 33*c* may be decreased. At another time or at another position, e.g., along a row 15 of vacuum ports 33, first vacuum port 33*a* and second vacuum port 33*b* may be uncovered, and third vacuum port 33*c* may be covered by workpiece 18. In this case, inflow through first vacuum port 33*a* and second vacuum port 33*b* may be increased, while inflow through third vacuum port 33*c* may be decreased (e.g., by more than when only first vacuum port 33*a* is uncovered). Therefore, the net outflow may gradually decrease with distance from leading edge 22 (or another edge) of workpiece 18, from a maximum net outflow (and maximum outward bending) near the edge to minimum net outflow (e.g., to the net outflow that is typical at interior points of workpiece 18) far from (e.g., more than twice the distance between two rows 15 from) the edge. This may be alternatively expressed as a gradual strengthening of the suction force with increasing distance from leading edge 22.

Airflow channels 32 may be positioned in a staggered fashion such that the overall configuration of connected vacuum ports 33 in any row 15 is similar or identical. For example, along a particular row 15, successive vacuum ports 33 may be positioned as first vacuum port 33*a*, second vacuum port 33*b*, and third vacuum port 33*c*. This pattern may be repeated to the end of that row 15. In this manner, the net outflow when an edge of workpiece 18 is near or at any row 15 of vacuum ports 33 may be substantially the same as when that edge is near or at any other row 15.

Figure 2B:
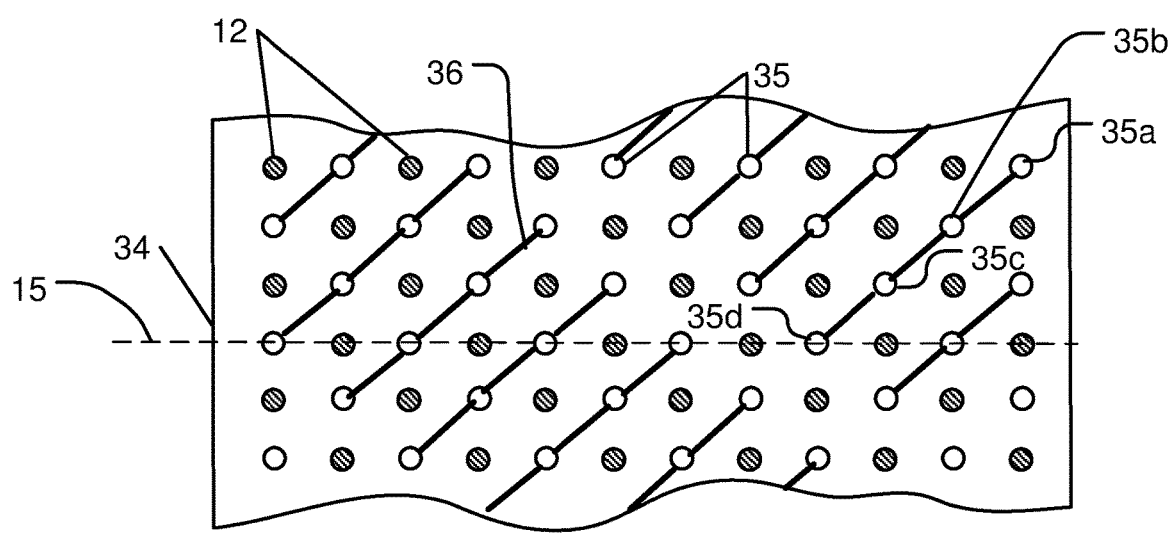
FIG. 2B schematically illustrates a variant of the noncontact support table shown in FIG. 2A in which each set of four collinear vacuum ports are connected by channels.

FIG. 2B schematically illustrates a variant of the noncontact support table shown in FIG. 2A in which each set of four collinear vacuum ports are connected by channels.

In noncontact support platform table 34, each set of four collinear vacuum ports 35 is connected by airflow channels

36. For example, a group of four collinear vacuum ports 35 that includes first vacuum port 35a, second vacuum port 35b, third vacuum port 35c, and fourth vacuum port 35d may be connected by airflow channels 36.

For example, first vacuum port 35a may be uncovered and second vacuum port 35b, third vacuum port 35c, and fourth vacuum port 35d may be covered by a workpiece 18. In this case, vacuum inflow through first vacuum port 35a may be increased (e.g., relative to inflow through a group of interconnected vacuum ports 35 that are at the interior of workpiece 18), and inflow through second vacuum port 35b, third vacuum port 35c, and fourth vacuum port 35d may be decreased. At another time or at another position, e.g., along a row 15 of vacuum ports 35, first vacuum port 35a and second vacuum port 35b may be uncovered, and third vacuum port 35c and fourth vacuum port 35d may be covered by workpiece 18. In this case, inflow through first vacuum port 35a and second vacuum port 35b may be increased, while inflow through third vacuum port 35c and fourth vacuum port 35d may be decreased (e.g., by more than when only first vacuum port 35a is uncovered). At another time or at another position, e.g., along a row 15 of vacuum ports 35, first vacuum port 35a, second vacuum port 35b, and third vacuum port 35c may be uncovered, and fourth vacuum port 35d may be covered by workpiece 18. In this case, inflow through first vacuum port 35a, second vacuum port 35b, and third vacuum port 35c may be increased, while inflow through fourth vacuum port 35d may be decreased (e.g., by more than when only first vacuum port 35a and second vacuum port 35b are uncovered). Therefore, the net outflow may gradually decrease with distance from leading edge 22 (or another edge) of workpiece 18, from a maximum net outflow (and maximum outward bending) near the edge to minimum net outflow (e.g., to the net outflow that is typical at interior points of workpiece 18) far from (e.g., more than three times the distance between two rows 15 from) the edge. This may be alternatively expressed as a gradual strengthening of the suction force with increasing distance from leading edge 22.

Airflow channels 36 may be positioned in a staggered fashion such that the overall configuration of connected vacuum ports 35 in any row 15 is similar or identical. For example, along a particular row 15, successive vacuum ports 35 may be positioned as first vacuum port 35a, second vacuum port 35b, third vacuum port 35c, and fourth vacuum port 35d. This pattern may be repeated to the end of that row 15. In this manner, the net outflow when an edge of workpiece 18 is near or at any row 15 of vacuum ports 35 may be substantially the same as when that edge is near or at any other row 15.

A configuration of an airflow channel 16, 32, or 36 may depend on a desired net outflow near an edge of a workpiece 18. The desired net outflow near the edge may, in turn, be determined by a desired bending of workpiece 18 at its edge. The desired bending may be determined by an expected inward warping or bending of the edges of workpiece 18.

For example, where a relatively large increase in net outflow is desired near an edge, airflow channels 16 (and similarly for airflow channels 32 or 36) may be configured to enable relatively unrestricted airflow. In this manner, the coupling between covered and uncovered connected vacuum ports 14 (or connected vacuum ports 33 or 35) may be relatively large. Therefore, edge lifting at the edge of workpiece 18 may be relatively large. On the other hand, where a relatively small increase in net outflow is desired near the edge, airflow channels may be configured to restrict airflow, decreasing the coupling between covered and uncovered vacuum ports 14 (e.g., the vacuum inflow through each vacuum port 14 is relatively independent of inflow through the connected vacuum port 14).

Airflow through an airflow channel 16 may be determined by a lateral size (e.g., width or diameter) of that airflow channel 16. Airflow through airflow channel 16 may be affected by one or more constrictions within airflow channel 16. One or more various configurations of constricted airflow channels may be incorporated in a noncontact support platform table 10 (or noncontact support platform table 30 or 34). For example, a constriction may be wedge-like, rectangular, labyrinthine, or otherwise shaped.

Figure 3A:
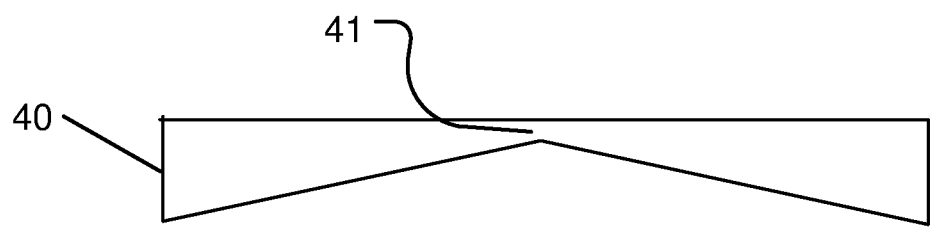
FIG. 3A schematically illustrates an example of an airflow channel for restricted airflow having a wedge-like constriction.

FIG. 3A schematically illustrates an example of an airflow channel for restricted airflow having a wedge-like constriction.

Constricted airflow channel 40 includes a gradually tapered asymmetric wedge-like constriction 41 that is formed by a triangular indentation. In some cases, a wedge-like constriction may be formed symmetrically by triangular indentations on both sides. In some cases, a channel may be monotonically tapered from one end to the other.

Figure 3B:
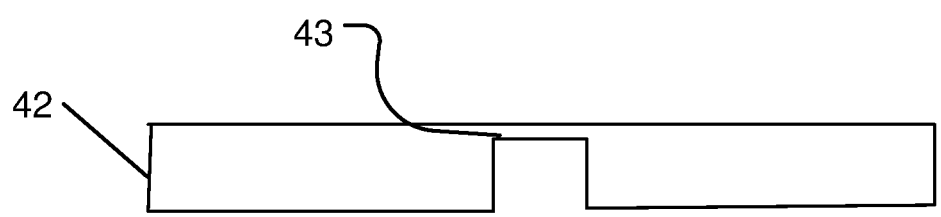
FIG. 3B schematically illustrates an example of an airflow channel for restricted airflow having a single rectangular constriction.

FIG. 3B schematically illustrates an example of an airflow channel for restricted airflow having a single rectangular constriction.

Constricted airflow channel 42 includes a rectangular constriction 43 that is formed by a single, asymmetric rectangular indention.

Figure 3C:
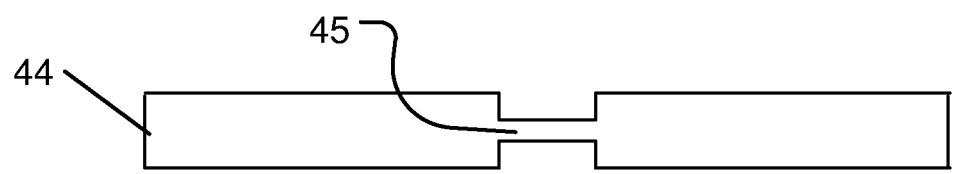
FIG. 3C schematically illustrates an example of an airflow channel for restricted airflow having a double rectangular constriction.

FIG. 3C schematically illustrates an example of an airflow channel for restricted airflow having a double rectangular constriction.

Constricted airflow channel 44 includes a rectangular constriction 45 that is formed by symmetric rectangular indentions on both sides.

Figure 3D:
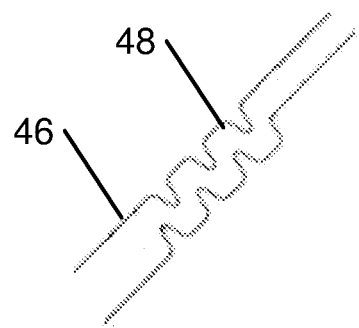
FIG. 3D schematically illustrates an example of an airflow channel for restricted airflow having a labyrinthine constriction.

FIG. 3D schematically illustrates an example of an airflow channel for restricted airflow having a labyrinthine constriction.

Constricted airflow channel 46 includes a labyrinthine constriction 48. For example, the width of a labyrinthine constriction, or the length or number of bends in a labyrinthine constriction may be varied. A labyrinthine constriction may be formed by a single straight channel into which projections alternately project from both sides of the channel.

In some cases, a noncontact support platform table, such as noncontact support platform table 10 (or noncontact support platform table 30 or 34) may be assembled from two or more layers. For example, channels that connect vacuum ports 14 (or vacuum ports 33 or 35) may be incorporated into, formed on, or confined to, a channel layer. Thus, the pattern or configuration of airflow channels 16 in noncontact support platform table 10 may be configured by selection or customization of the channel layer. Similarly, the pattern or configuration of airflow channels 16 in noncontact support platform table 10 may be modified by replacement of the channel layer.

Figure 4:
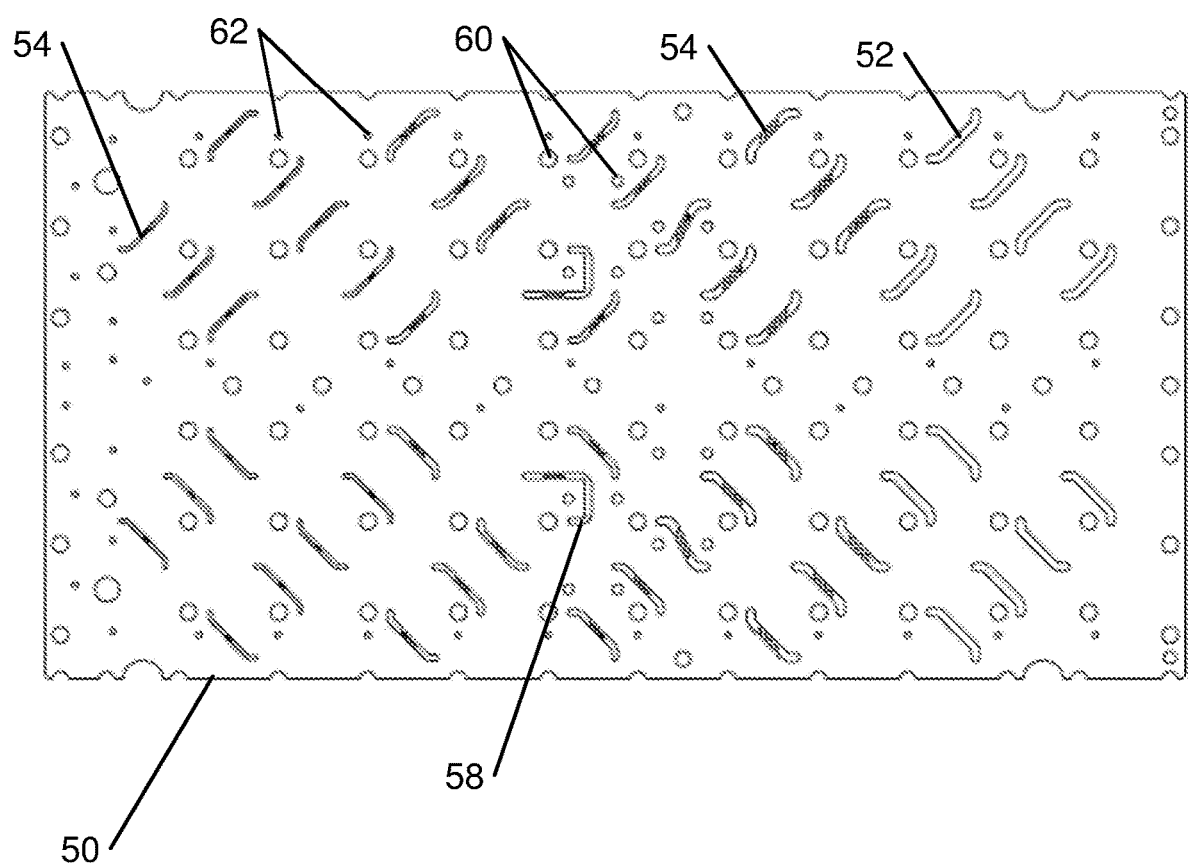
FIG. 4 schematically illustrates a channel layer of a noncontact support platform table with edge lifting.

FIG. 4 schematically illustrates a channel layer of a noncontact support platform table with edge lifting.

Channel layer 50 is configured for assembly in a noncontact support platform table below an outermost layer. Channel layer 50 includes slots for forming airflow channels of noncontact support platform table 10 when channel layer 50 is assembled into noncontact support platform table 10.

For example, the outermost layer may include pressure ports 12 and vacuum ports 14, e.g., as shown in FIG. 1A. Various openings and channel slots on channel layer 50 may be formed by machining a sheet of metal or plastic.

For example, port openings 60 on channel layer 50 may be aligned with corresponding pressure ports 12 and vacuum ports 14 (e.g., vacuum ports 14 that are not interconnected) on the outermost layer. Openings 62 may be used in assembly of channel layer 50 into a noncontact support platform table, for attachment of various (e.g., processing or inspection) devices or structures to the noncontact support platform table, or for another purpose.

Ends of channel slots 52 and restricted channel slots 54 may be aligned with vacuum ports 14 on the outermost layer. Thus, when channel layer 50 is assembled into the noncontact support platform table, channel slots 52 may function as airflow channels 16. Similarly, in the example, shown, restricted channel slots 54 may function as restricted airflow channels 46.

Typically, channel slots of a channel layer 50 may all have similar characteristics (e.g., width, presence, absence, or type of constriction, or another characteristic). A channel layer 50 as shown, that includes different known regions, each provided with a different type of channel slot 52 or restricted channel slot 54, may be utilized in determining the suitability of channel slots with different characteristics for a particular application or type of workpiece. For example, a channel layer 50 with different types of channel slots 52 and restricted channel slots 54 may be utilized by a facility that manufactures, produces, or customizes noncontact support platform tables for various end users.

In some cases, one or more design considerations may not enable a direct connection between two vacuum ports 14 by a (straight) channel slot 52. In such a case, a bent channel slot 58 may enable the resulting airflow channel 16 to bypass structure or regions through which the airflow channel 16 cannot directly pass.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A noncontact support platform comprising:
   a plurality of pressure ports distributed on a surface of a table, each pressure port connected to a pressure source to cause fluid to flow outward through the pressure port;
   a plurality of vacuum ports distributed on the surface of the table, each vacuum port connected to a vacuum source to cause fluid to flow inward through the vacuum port, the outward flow through the pressure ports and the inward flow through the vacuum ports configured to form a fluid cushion to support a workpiece at a nonzero distance from the table; and
   a plurality of channels, each channel connecting at least two of the vacuum ports to enable flow of fluid between the connected vacuum ports via the channel, the plurality of channels being oriented non-perpendicularly to a direction of transport of the workpiece along the noncontact support platform such that when one of the connected vacuum ports is covered by an edge of the workpiece and the other connected vacuum port is not covered by the workpiece, a suction force that is exerted by the connected vacuum ports on the edge is weaker than the suction force that is exerted by the connected vacuum ports on a part of the workpiece where both of the connected vacuum ports are covered.

2. The noncontact support platform of claim 1, wherein said plurality of channels are oriented at an oblique angle to a side of the table.

3. The noncontact support platform of claim 1, wherein the table is rectangular and said plurality of channels are oriented at a 45° angle to a side of the table.

4. The noncontact support platform of claim 1, wherein a channel of said plurality of channels includes a constriction.

5. The noncontact support platform of claim 4, wherein the constriction is wedge-like, rectangular or labyrinthine.

6. The noncontact support platform of claim 5, wherein the constriction comprises a self adaptive segmented orifice (SASO) labyrinth.

7. The noncontact support platform of claim 1, wherein at least three collinear vacuum ports are connected to one another by at least two channels.

8. The noncontact support platform of claim 1, wherein said plurality of channels are incorporated into a layer that is configured for assembly into the table.

9. The noncontact support platform of claim 1, wherein the fluid comprises air.

* * * * *